US006809569B2

(12) United States Patent
Wang et al.

(10) Patent No.: US 6,809,569 B2
(45) Date of Patent: Oct. 26, 2004

(54) CIRCUIT, APPARATUS AND METHOD HAVING A CROSS-COUPLED LOAD WITH CURRENT MIRRORS

(75) Inventors: Yueyong Wang, Santa Clara, CA (US); Chanh Tran, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/085,782

(22) Filed: Feb. 28, 2002

(65) Prior Publication Data

US 2003/0160642 A1 Aug. 28, 2003

(51) Int. Cl.[7] ................................................ H03K 3/017

(52) U.S. Cl. ......................................... 327/175; 327/55

(58) Field of Search ......................... 327/175, 172–174, 327/231, 234–237, 91, 52.5, 56; 365/206, 207, 208

(56) References Cited

U.S. PATENT DOCUMENTS 5,572,158 A 11/1996 Lee et al. ................... 327/175
5,825,209 A * 10/1998 Stark et al. .................... 327/3
6,111,445 A * 8/2000 Zerbe et al. ................ 327/231
6,204,697 B1 * 3/2001 Zerbe .......................... 326/98

* cited by examiner

*Primary Examiner*—Minh Nguyen
(74) *Attorney, Agent, or Firm*—Vierra Magen Marcus Harmon & DeNiro LLP

(57) ABSTRACT

A circuit includes a first node having a first variable voltage and a second node having a second variable voltage. A clock signal generates the first variable and second variable voltages. A first transistor is coupled to the first node and provides a first current responsive to a first control voltage being applied to the first transistor gate. A second transistor is coupled to the second node and provides a second current responsive to a second control voltage being applied to the second transistor gate. A first control circuit is coupled to the first transistor gate and the second node. The first control circuit provides the first control voltage responsive to the first variable voltage. A second control circuit is coupled to the second transistor gate and the first node. The second control circuit provides the second control voltage responsive to the second variable voltage. The first and second currents are used to provide a duty cycle correction signal.

12 Claims, 8 Drawing Sheets

CIRCUIT, APPARATUS AND METHOD HAVING A CROSS-COUPLED LOAD WITH CURRENT MIRRORS

FIELD OF THE INVENTION

The present invention relates to a cross-coupled load circuit.

BACKGROUND OF THE RELATED ART

A cross-coupled load circuit is often used in many applications. FIG. 1 illustrates a circuit 100 that is often referred to as a cross-coupled load circuit. Ideally, current $I_1$ equals current $I_3$ and current $I_2$ equals current $I_4$ during operation. Or in other words, $I_1+I_2=I_3+I_4$. However, this matching relationship between currents is generally not precisely observed. Current mismatch may occur due to transistor channel length modulation effect. Also, for certain voltages DCCP and DCCN applies to nodes 101 and 102, respectively; transistors in circuit 100 may not be in respective saturation regions. If a transistor is not in a saturation region, current cannot be precisely controlled. If the current cannot be controlled, the cross-coupled load will not be balanced. A n-type transistor is operating in a saturation region when the transistor's gate voltage $V_G$ minus the transistor's drain voltage $V_D$ is less than the transistor's threshold voltage $V_T$. A transistor's threshold voltage $V_T$ is defined as the voltage between a transistor's gate $V_G$ and a transistor's source $V_S$ at which a transistor begins to conduct.

Circuit 100 includes transistors that should operate in respective saturation regions. Transistors 107, 108, 109 and 110 are coupled to ground 111 and act as switches, respectively, for power consumption purpose when respective portions of circuit 100 are not in use, responsive to a NOP signal at node 120. Transistors 103 and 106 are likely to be in a saturation region as they are diode connected. Yet, transistors 104 and 105 may not be in a saturation region for certain voltage values of DCCP and DCCN. For transistors 104 and 105 to be in a saturation region, $|DCCP-DCCN|<V_T$. As transistors continue to scale down along with corresponding threshold voltages $V_T$, it will be more difficult to ensure that transistors 104 and 105 are in saturation regions for voltage values of DCCP and DCCN.

While it may be desirable to provide a relatively small voltage drop $|DCCP-DCCN|$ to ensure that transistors 104 and 105 are in a saturation region and thus current matching is occurring, a relatively larger voltage drop $|DCCP-DCCN|$ may be desirable for other reasons. Even if a particular transistor operating condition, also known as a Process Voltage Temperature ("PVT"), allows for a transistor to have a relatively small $V_T$, other PVT corners may allow an unacceptably small voltage drop $|DCCP-DCCN|$ for a particular application. For example, FIG. 2 illustrates a transistor in a Fast Fast Hot ("FFH") operating condition represented by curve 210 having the lowest $V_T$ with a voltage drop $|DCCP-DCCN|$ 205, or approximately 180 mv. As can be seen, a voltage drop $|DCCP-DCCN|$ reduces to 204, or approximately 105 mv, for a Typical Typical ("TT") operating condition represented by curve 211 and further reduces to a voltage drop $|DCCP-DCCN|$ 203, or approximately 60 mv, for a Slow Slow Hot ("SSH") operating condition represented by curve 212. Accordingly, if a circuit application requires a voltage drop $|DCCP-DCCN|$ of greater than 60 mv, a transistor having this lowest threshold voltage $V_T$ cannot be used. Thus, some applications that require a larger voltage drop over DCCP and DCCN are not able to use transistors with relatively low threshold voltages $V_T$.

Moreover, circuit 100 may be used for correcting a duty cycle of a clock signal in a receiving or transmitting circuit. Thus, any current mismatch may lead to an erroneous duty cycle of a clock signal and thereby increase data error rates.

Therefore, it is desirable to provide a circuit and method for providing a cross-coupled load circuit with current mirrors that allows the transistors to operate in a saturation region in response to a relatively large voltage drop over DCCP and DCCN. It is also desirable to provide an apparatus that produces an improved clock signal and thereby reduces data error rates of incoming serial data.

SUMMARY

A circuit, apparatus and method for providing a cross-coupled load with built-in current mirrors are provided in embodiments of the present invention.

In an embodiment of the present invention, a circuit comprises a first node for providing a variable first voltage and a second node for providing a variable second voltage, wherein the first voltage is different from the second voltage. A first transistor is coupled to the first node and provides a first current responsive to a first control voltage being applied to the first transistor gate. A second transistor is coupled to the second node and provides a second current responsive to a second control voltage being applied to the second gate. A first control circuit is coupled to the first transistor gate and the second node. The first control circuit provides the first control voltage responsive to the variable second voltage. A second control circuit is coupled to the second gate and the first node. The second control circuit provides the second control voltage responsive to the variable first voltage.

According to an embodiment of the present invention, the first and second transistors operate in a saturation region.

According to another embodiment of the present invention, the circuit further comprises a third transistor that is coupled to the first node and provides a third current responsive to the first variable voltage. A fourth transistor is coupled to the second node and provides a fourth current responsive to the second variable voltage.

According to another embodiment of the present invention, the first current approximately equals the fourth current and the third current approximately equals the second current.

According to another embodiment of the present invention, the first variable voltage and the second variable voltage represent a clock signal.

According to an embodiment of the present invention, the clock signal has an amplitude of greater than approximately 400 mv.

According to an embodiment of the present invention, the first current, the second current, the third current and the fourth current are used to provide a duty cycle correction signal.

According to an embodiment of the present invention, the first transistor, the second transistor, the third transistor and the fourth transistor are n-type transistors.

According to an embodiment of the present invention, the first control circuit comprises a fifth transistor that is coupled to a voltage source. A sixth transistor is coupled to the fifth transistor. The fifth transistor gate is coupled to the first transistor gate. The sixth transistor is coupled to the voltage source. A seventh transistor is coupled to the sixth transistor. The seventh transistor gate is coupled to the second node.

According to another embodiment of the present invention, the second control circuit comprises an eighth transistor that is coupled to the voltage source. A ninth transistor is coupled to the eighth transistor and the ninth transistor gate is coupled to the first node. A tenth transistor is coupled to the voltage source. An eleventh transistor is coupled to the tenth transistor. The eleventh transistor gate is coupled to the second transistor gate.

According to an embodiment of the present invention, the circuit is a cross-coupled load with built-in current mirrors circuit used in a double data rate receiving circuit for improving a clock signal.

According to an embodiment of the present invention, the circuit is a cross-coupled load with built-in current mirrors circuit used in a double data rate transmitting circuit for improving a clock signal.

According to an embodiment of the present invention, the circuit is in a memory device.

According to an embodiment of the present invention, the circuit is in a memory device controller.

According to an embodiment of the present invention, an apparatus comprising a transmit circuit for transmitting serial data and a receive circuit are provided. The receive circuit generates an output signal responsive to the serial data. The receive circuit includes a first node for providing a variable first voltage and a second node for providing a variable second voltage. A first transistor is coupled to the first node and provides a first current responsive to a first control voltage being applied to the first gate. A second transistor is coupled to the second node and provides a second current responsive to a second control voltage being applied to the second gate. A first control circuit is coupled to the first gate and the second node. The first control circuit provides the first control voltage responsive to the variable second voltage. A second control circuit is coupled to the second gate and the first node. The second control circuit provides the second control voltage responsive to the variable first voltage.

According to an embodiment of the present invention, the transmit circuit is included in a memory controller and the receive circuit is included in a memory device.

According to an embodiment of the present invention, the receive circuit is a circuit used for improving a clock signal.

According to an embodiment of the present invention, a method comprises a step of obtaining a clock signal. A first voltage from the clock signal is applied to a first transistor operating in a saturation region. A second voltage from the clock signal is applied to a second transistor operating in a saturation region. A first current is provided responsive to applying the first voltage to the first transistor. A second current is provided responsive to applying the second voltage to the second transistor.

According to another embodiment of the present invention, the first voltage is applied to a third transistor operating in a saturation region. The second voltage is applied to a fourth transistor operating in a saturation region. A third current is provided responsive to applying the first voltage to the third transistor. A fourth current is provided responsive to applying the second voltage to the fourth transistor.

According to an embodiment of the present invention, the first current, the second current, the third current and the fourth current are used to provide an a duty cycle correction signal to the clock signal.

These and other embodiments of the present invention, as well as other aspects and advantages are described in more detail in conjunction with the figures, the detailed description, and the claims that follow.

DETAILED DESCRIPTION

Figure 3:
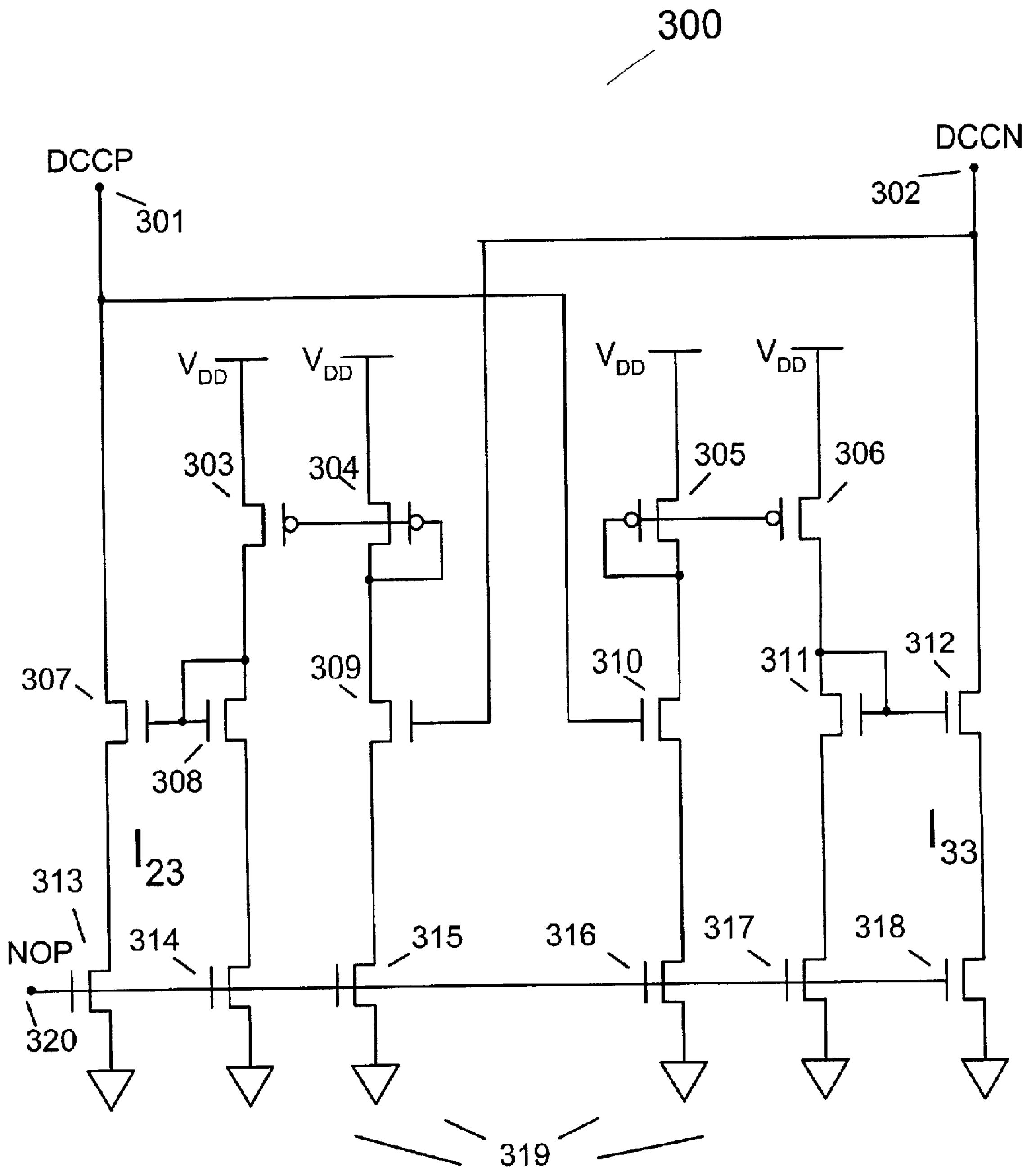
FIG. 3 is a schematic of a circuit in accordance with an embodiment of the present invention.

FIG. 3 illustrates a circuit 300 having a cross-coupled load with built-in current mirrors in an embodiment of the present invention. Circuit 300 has transistors that can operate in respective saturation regions even while the voltage drop across nodes 301 and 302 is relatively high. A voltage DCCP and a voltage DCCN are applied to nodes 301 and 302, respectively. In an embodiment of the present invention, voltages DCCP and DCCN are positive voltages, wherein voltage DCCP is greater than voltage DCCN. In an embodiment of the present invention, voltages DCCP and DCCN are obtained from a clock signal. In an embodiment of the present invention, a clock signal arrives with incoming serial data or is obtained from incoming serial data and is then used for sampling the incoming serial data. In an embodiment of the present invention, the absolute value of the difference between voltage DCCP and voltage DCCN, |DCCP−DCCN|, is approximately equal to or greater than 400 mv in order to obtain good dither performance of the clock signal corrected by a correction control signal, |DCCP−DCCN|, provided by circuit 300 illustrated in FIG. 3. Dither performance is defined as clock timing uncertainty due to any noise coupled to voltages DCCN and DCCP. In circuit 300, the effect of undesirable ripple in the voltages DCCP and DCCN is reduced as the voltage drop |DCCP−DCCN| increases.

Figure 4:
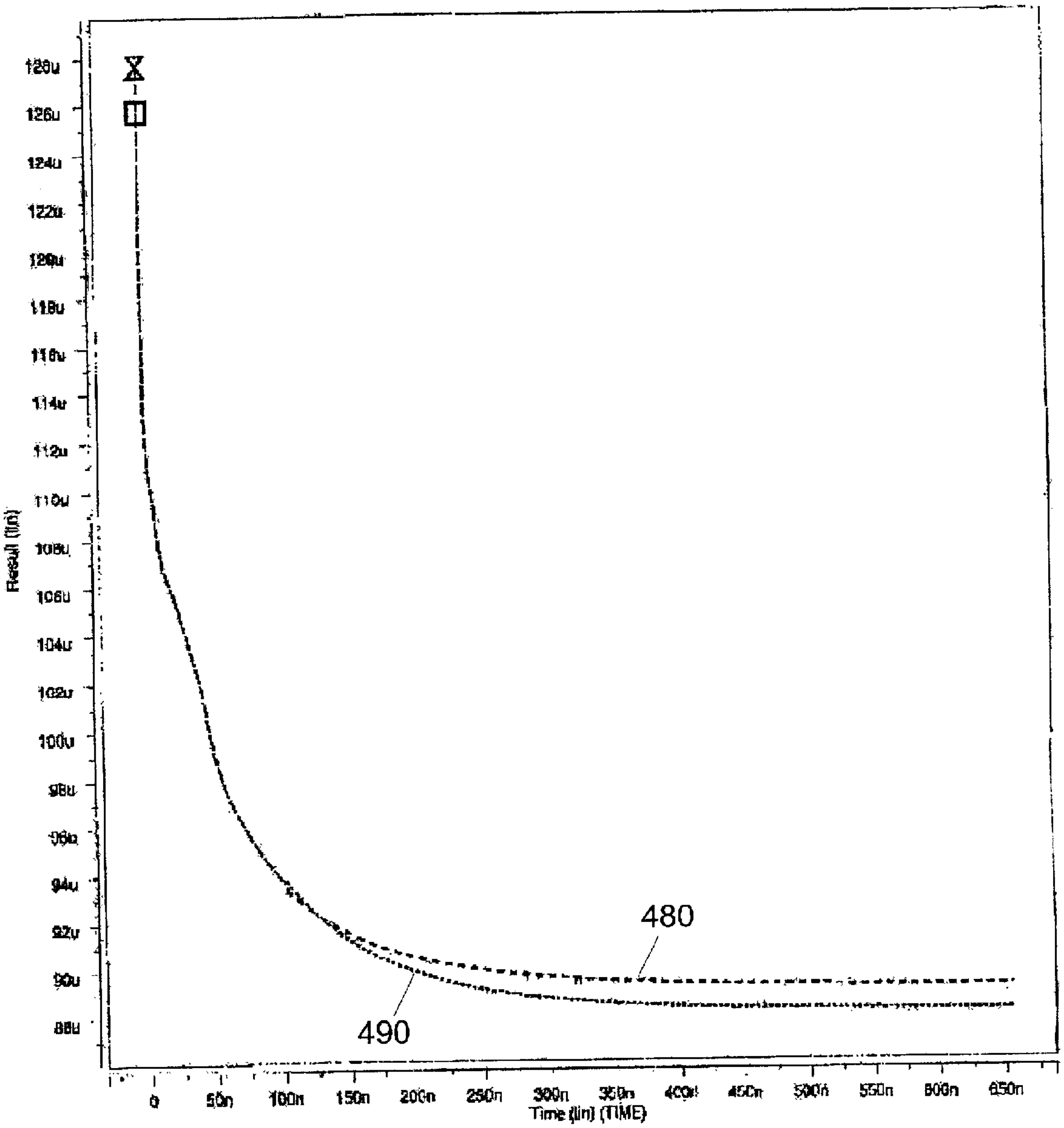
FIG. 4 illustrates curves representing current during the operation of the circuit illustrated in FIG. 3.

In an embodiment of the present invention, circuit 300 replaces transistors 104, 105, 108 and 109 to provide current $I_{23}$ and $I_{33}$. In an embodiment of the present invention, current $I_{23}$ corresponds to current $I_2$ and current $I_{33}$ corresponds to current $I_3$ such that $I_1+I_{23}=I_{33}+I_4$. As can be seen in FIG. 4, current $I_{33}$ represented by curve 480 is approximately equal to current $I_{23}$ represented by curve 490. Current is measured in microamps and time is measured in nanoseconds. In an embodiment of the present invention, circuit 300 is coupled with circuit 100 and transistors 104, 105, 108 and 109 can be optionally excluded, or shorted, while circuit 300 may be optionally added. For example, node 301 and 302 are coupled to nodes 101 and 102, respectively.

The built-in current mirrors sense voltages DCCP and DCCN and convert the voltages into currents $I_{23}$ and $I_{33}$ through transistors 307 and 312, respectively. A first current mirror includes transistors 303, 304, 308 and 309. A second current mirror includes transistors 305, 306, 310 and 311. The built-in current mirrors act as level-shifters and do not have to meet the condition of |DCCP−DCCN|<$V_T$ to have all transistors operating in a saturation region. Thus, a corrected clock signal, generated from the voltage drop |DCCP−DCCN|, will have improved dither performance by increasing the voltage drop. In particular, node 301 is coupled to a drain of transistor 307 and a gate of transistor 310. A source of transistor 307 is coupled to a switch, such as a drain of transistor 313. gate of transistor 313 is coupled to node 320 and a source of transistor 313 is coupled to ground 319. In an embodiment of the present invention, transistors 307 and 313 are n-type transistors.

A first control circuit including a voltage source $V_{DD}$, transistors 303, 304, 308, 309, 314 and 315, supplies a control voltage to a gate of transistor 307. A source of p-type transistor 303 is coupled to a voltage source $V_{DD}$ and a drain of p-type transistor 303 is coupled to a drain of n-type transistor 308. In an embodiment of the present invention, voltage source $V_{DD}$ is approximately 1.8 volts. A source of transistor 308 is coupled to a drain of transistor 314 having a gate coupled to node 320 and a source coupled to ground 319. A drain and gate of transistor 308 is coupled to a gate of transistor 307. A gate of transistor 303 is coupled to a gate of transistor 304 having a source coupled to voltage source $V_{DD}$. A drain and gate of transistor 304 is coupled to a drain of transistor 309. Node 302 providing a voltage DCCN is coupled to a gate of transistor 309. A source of transistor 309 is coupled to a drain of transistor 315. A gate of transistor 315 is coupled to node 320 and a source of transistor 315 is coupled to ground 319. A NOP signal is provided to node 320 in order to control an on/off operation of transistors 313, 314, 315, 316, 317 and 318. In an embodiment of the present invention, transistors 303 and 304 are p-type transistors. In an embodiment of the present invention, transistors 308, 309, 314 and 315 are n-type transistors.

A second control circuit including a voltage source $V_{DD}$, transistors 305, 306, 310, 311, 316 and 317, supplies a control voltage to a gate of transistor 312. A source of transistor 306 is coupled to a voltage source $V_{DD}$ and a drain of transistor 306 is coupled to a drain of transistor 311. A source of transistor 311 is coupled to a drain of transistor 317 having a gate coupled to node 320 and a source coupled to ground 319. A drain and gate of transistor 311 is coupled to a gate of transistor 312. A gate of transistor 306 is coupled to a gate of transistor 305 having a source coupled to voltage source $V_{DD}$. A drain and gate of transistor 305 is coupled to a drain of transistor 310. Node 301 providing a voltage DCCP is coupled to a gate of transistor 310. A source of transistor 310 is coupled to a drain of transistor 316. A gate of transistor 316 is coupled to node 320 and a source of transistor 316 is coupled to ground 319. In an embodiment of the present invention, transistors 305 and 306 are p-type transistors. In an embodiment of the present invention, transistors 310, 311, 316 and 317 are n-type transistors.

Figure 1:
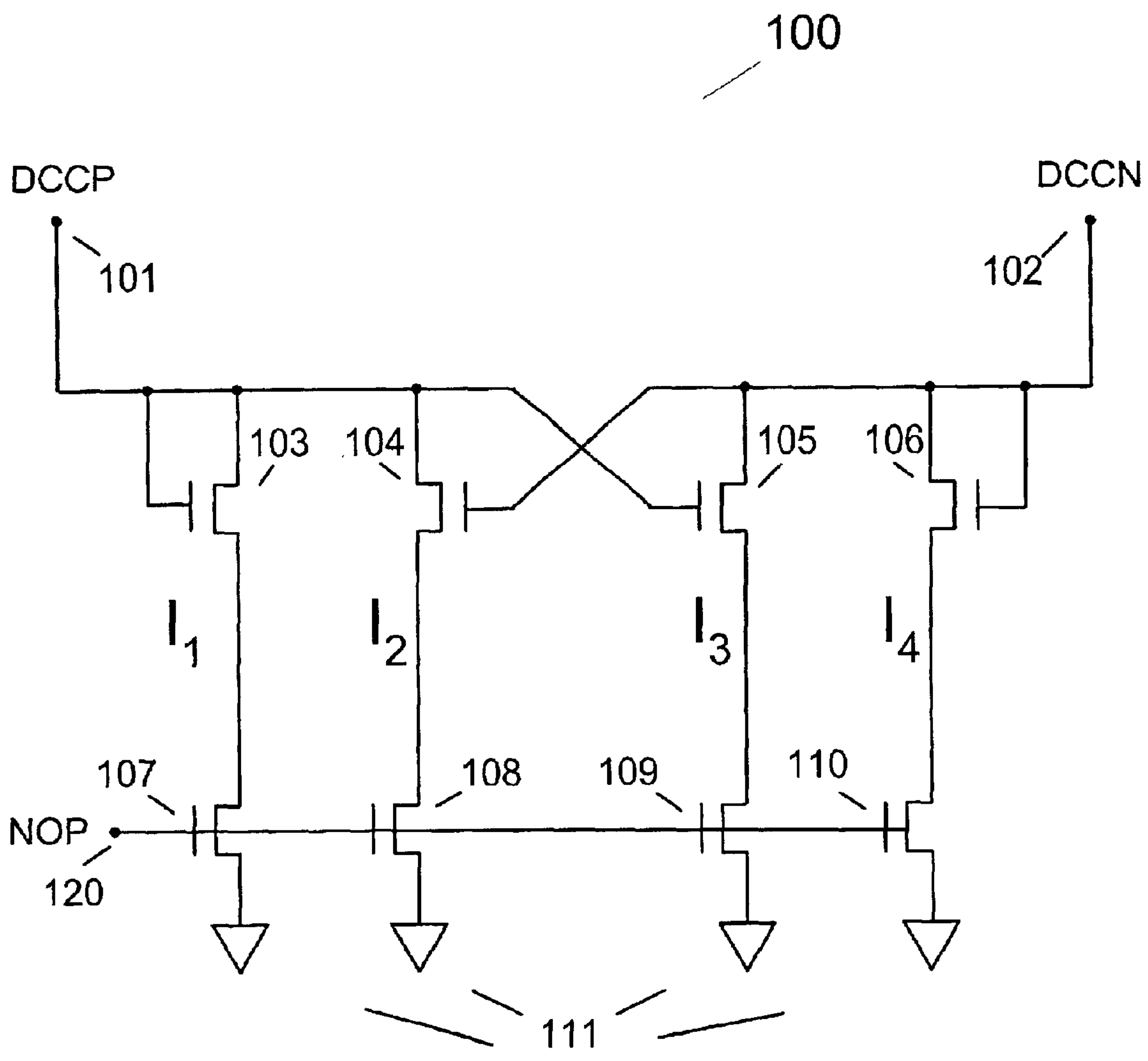
FIG. 1 is a schematic of a cross-coupled load circuit.
Figure 2:
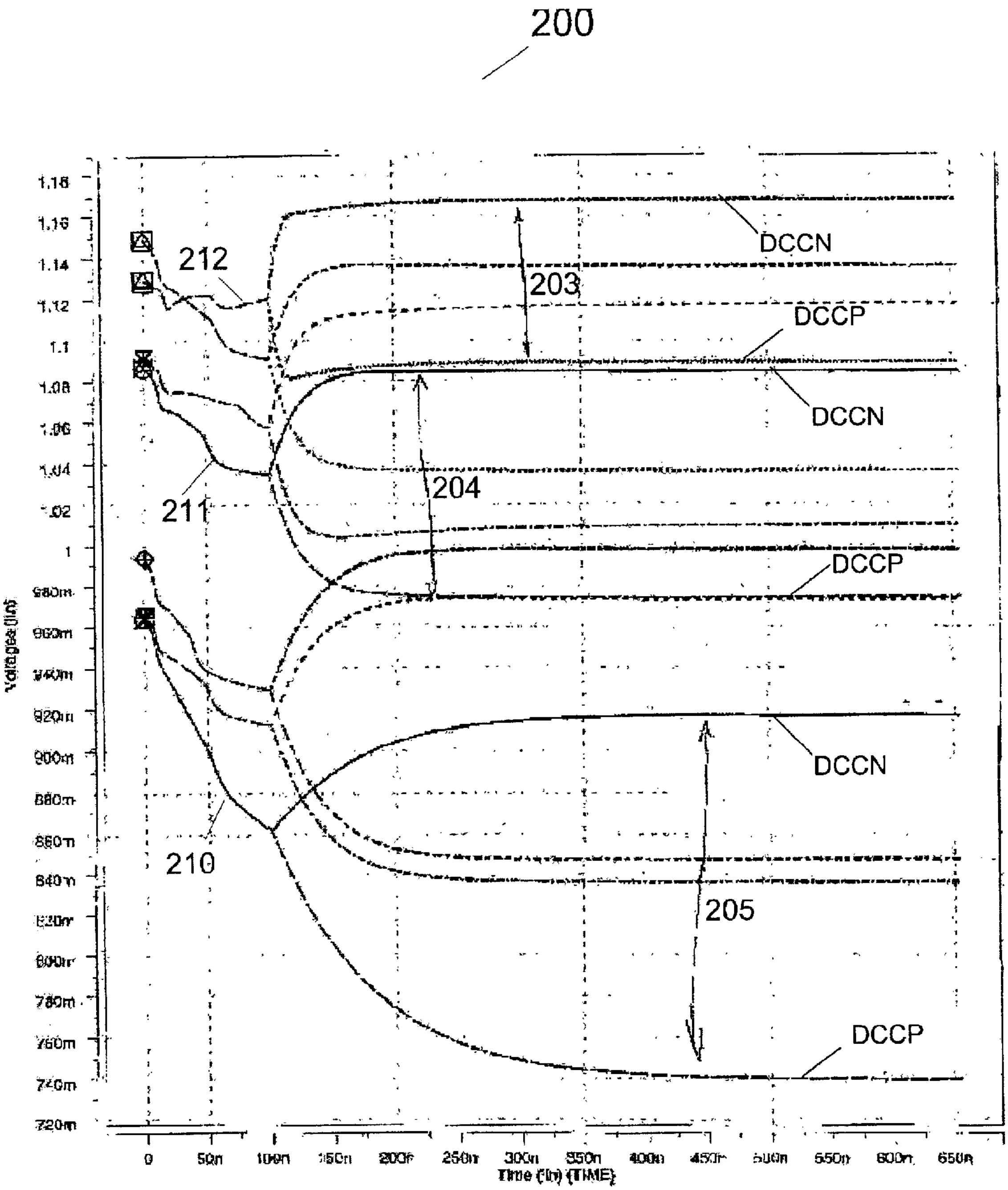
FIG. 2 illustrates voltage drops |DCCP−DCCN| under various PVT corner transistor operating conditions when applying a clock signal to a circuit of FIG. 1.
Figure 5:
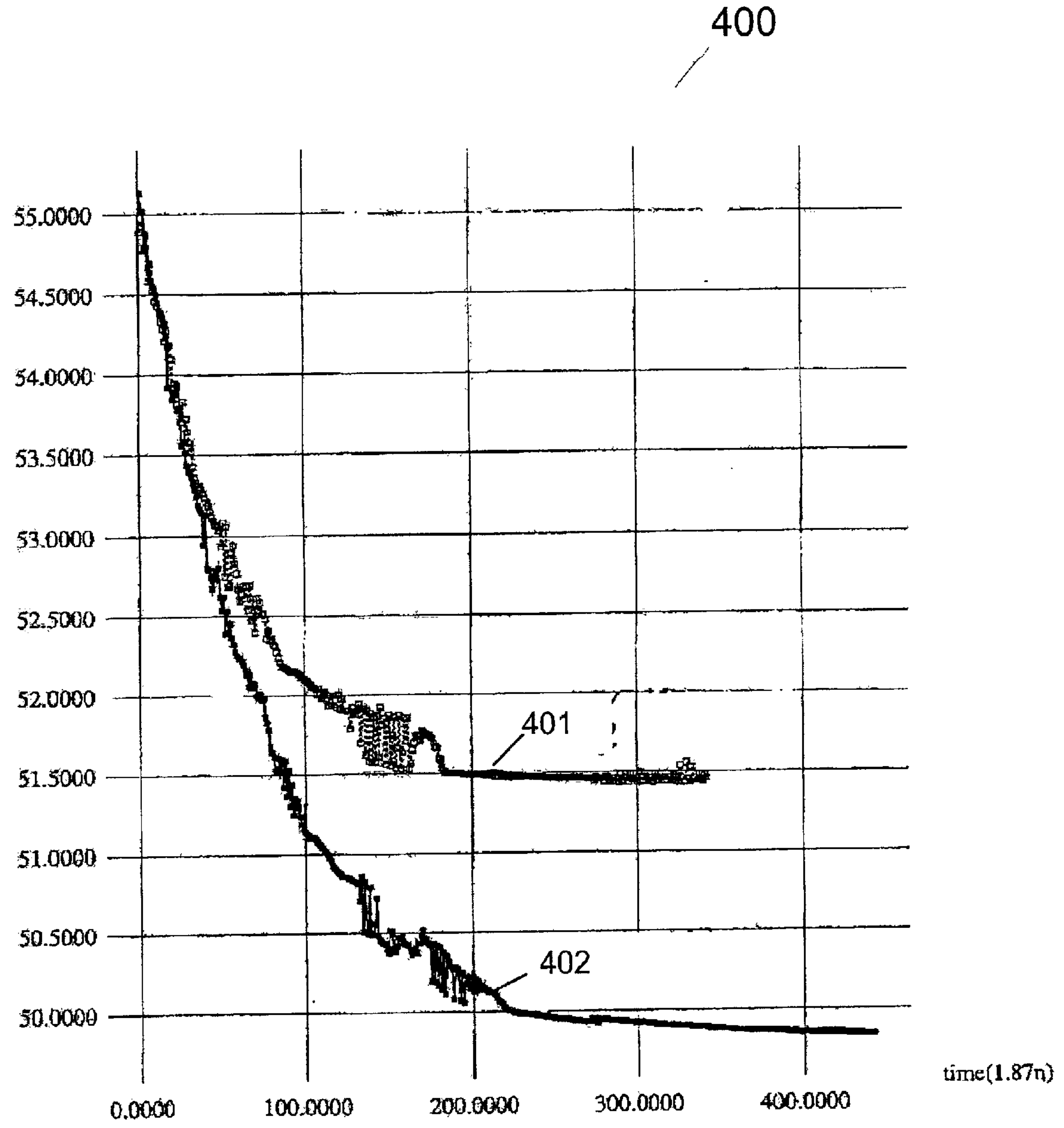
FIG. 5 illustrates a comparison of a duty cycles when using the circuits illustrated in FIGS. 1 and 2 in accordance with an embodiment of the present invention.

FIG. 5 illustrates an improved duty cycle using a circuit 300 of FIG. 3 when transistors are in a FFH operating condition. FIG. 5 shows duty cycle percentage verses time measured in 1.87 nanosecond units. Curve 401 represents a duty cycle of a clock signal corrected by using a circuit 100, shown in FIG. 1, in order to obtain a duty cycle of approximately 51.5%. An ideal 50% duty cycle is not obtained due to current mismatch. In contrast, curve 402 represents a duty cycle of a clock signal corrected by circuit 300 to match currents. Curve 402 shows a steady state ideal duty cycle of approximately 50%. This improved duty cycle allows for generating a clock signal that is used by a receiving circuit in improving a set-up and hold uncertainty window when sampling incoming serial data and thus reduces data error rates.

Figure 6:
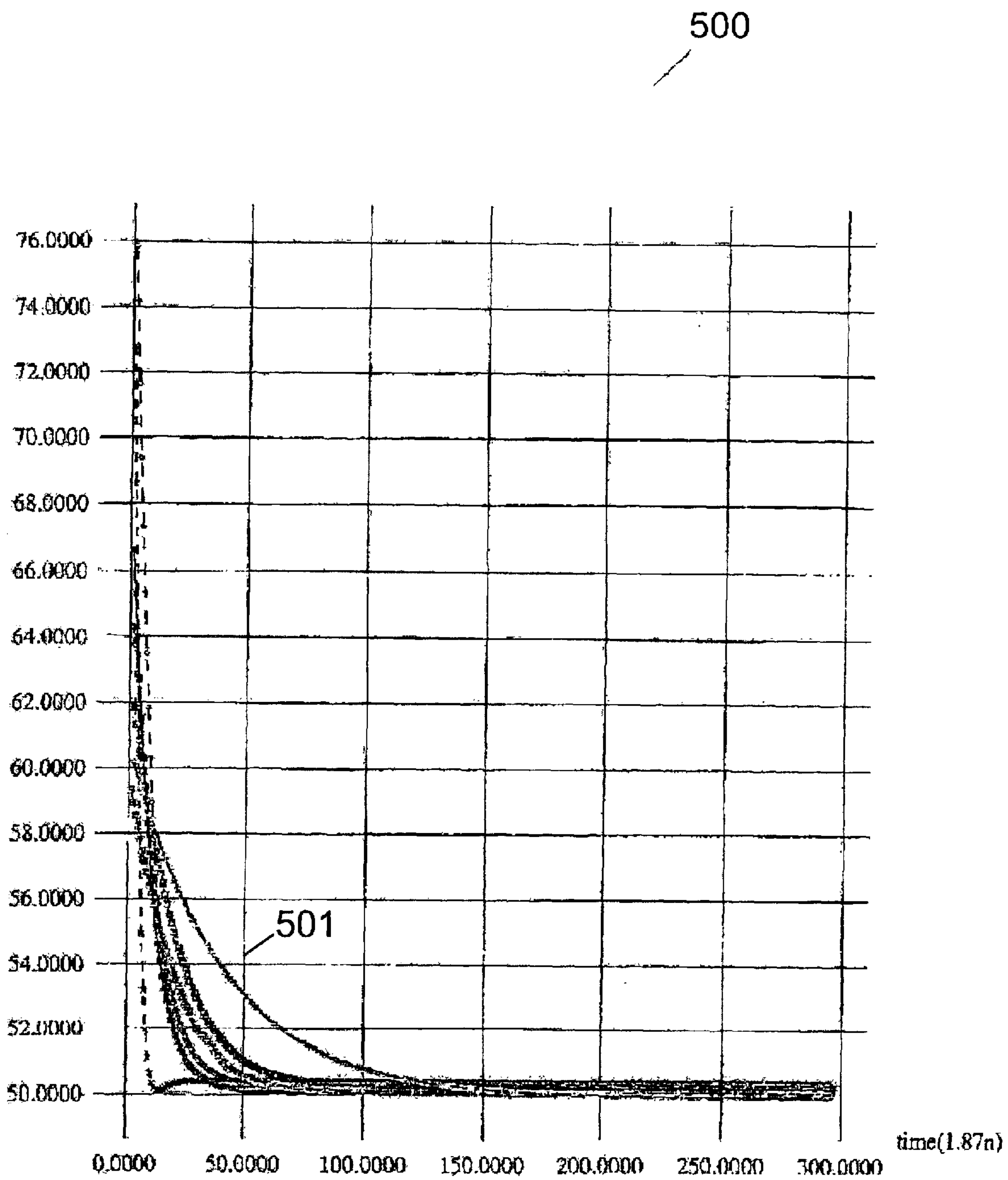
FIG. 6 illustrates duty cycles of clock signals under various PVT corners when using the circuit illustrated in FIG. 3 in accordance with an embodiment of the present invention.

FIG. 6 illustrates curves 501 representing duty cycle values obtained using circuit 300 for all the PVT corners. FIG. 6 shows duty cycle percentages verses time measured in 1.87 nanosecond units. As can be observed, under all the PVT corners operating conditions, fast fast low temperture ("ffl"), slow slow low tempertature ("ssl"), fast slow ("fs"), slow fast ("sf"), fast fast hot temperature ("ffh"), typical typical, ("tt"), and slow slow hot ("ssh"), an approximate 50% duty cycle is obtained using circuit 300.

Figure 7:
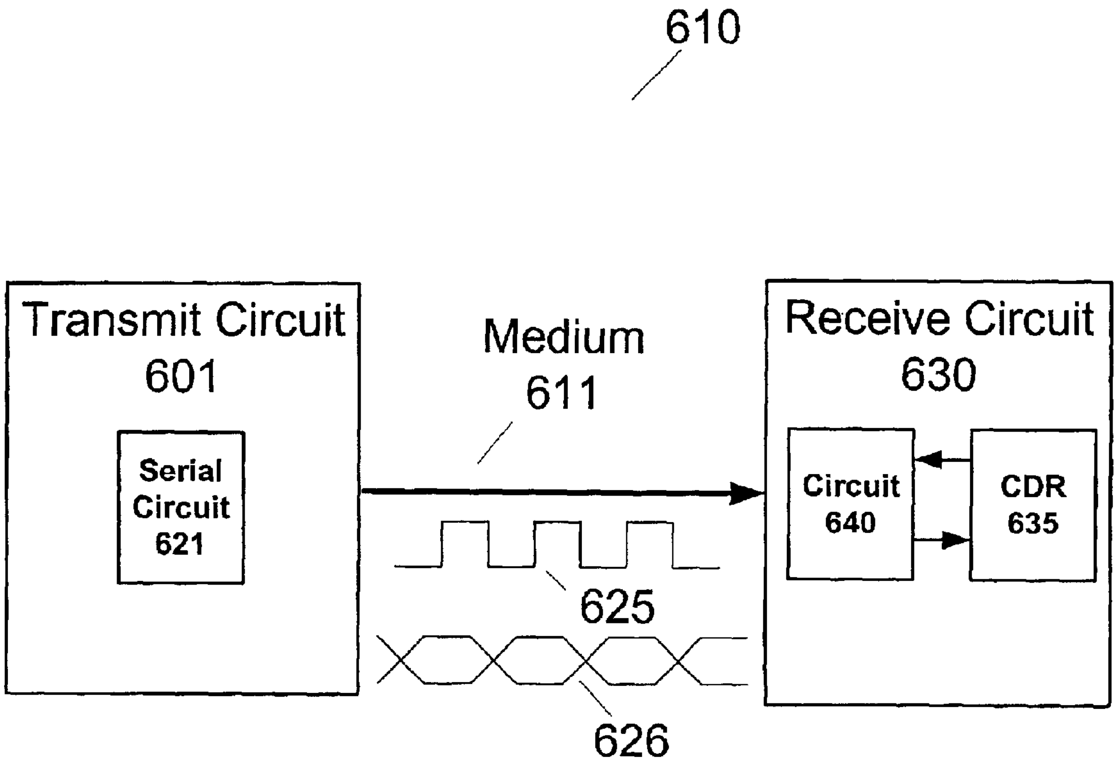
FIG. 7 illustrates a communication apparatus having a circuit in accordance with an embodiment of the present invention.

FIG. 7 illustrates a communication apparatus 610, such as a Double Data Rate ("DDR") system, according to an embodiment of the present invention. In an embodiment of the present invention, communication apparatus 610 includes a transmit circuit 601 and a receive circuit 630 coupled by medium 611. In an embodiment of the present invention, transmit circuit 601, and in particular serial circuit 621, generates serial data 625 on medium 611 to receive circuit 630. In an alternate embodiment of the present invention, a differential or single ended clock signal 626 is also sent via medium 611 In an embodiment of the present invention, transmit circuit 601 is a memory controller. In an alternate embodiment of the present invention receive circuit 630 is a memory device, such as a Dynamic Random Access Memory ("DRAM") device or a Rambus Dynamic Random Access Memory ("RDRAM") device.

In an alternate embodiment of the present invention, circuit 640 is included in transmit circuit 601.

In an embodiment of the present invention, medium 611 is a wire or set of wires for transporting signals, such as voltage signals. In an embodiment of the present invention, medium 611 is a bidirectional data bus that may carry data information, control information or both. In an alternate embodiment of the present invention, medium 611 is a unidirectional bus. In still a further embodiment of the present invention, medium 611 includes a wireless or photonics connection.

Receive circuit 630 includes a Clock Data Recovery unit ("CDR") 635 for actively looking for transitions in the incoming data pattern and phase aligns the sampling clock edges with respect to the incoming data. CDR 635 recovers a clock signal having a duty cycle used for sampling the incoming serial data 625. In an embodiment of the present invention, the duty cycle, recovered from incoming serial data 625, is greater than or less than a preferred 50%. Yet, an accurate duty cycle of a clock signal reduces error rates in obtaining data from serial data 625. CDR 635 samples the serial data and then deserializes the sampled serial data in an embodiment of the present invention. Receive circuit 630 also includes a cross-coupled load circuit 640 for outputting a duty cycle correction signal in response to a clock signal obtained from CDR 635. In particular, voltages DCCP and DCCN are obtained from a clock signal in CDR 635 and circuit 640. In an embodiment of the present invention, cross-coupled load circuit 640 is circuit 300 illustrated in FIG. 3. Voltage drop |DCCP−DCCN| is used by CDR 635 as a duty cycle correction signal to adjust the uncorrected clock signal to a corrected clock signal having an approximate 50% duty cycle. Thus, an improved clock signal is provided that leads to improved data error rates.

Figure 8:
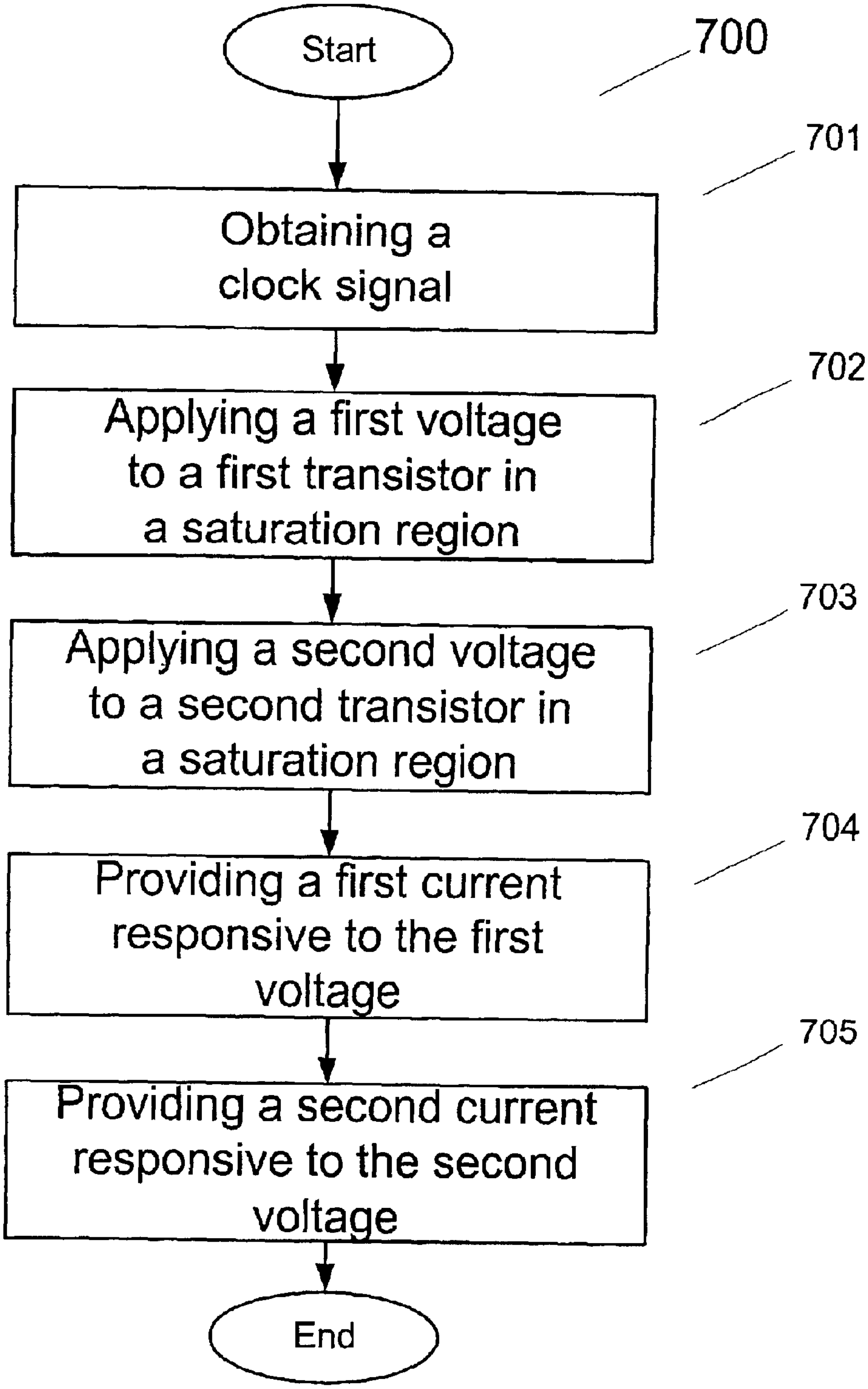
FIG. 8 illustrates a method in accordance with an embodiment of the present invention.

FIG. 8 illustrates a method 700 according to an embodiment of the present invention. In alternate embodiments of the present invention, steps illustrated in FIG. 8 are carried out by hardware, software or a combination thereof. In alternate embodiments, the steps illustrated in FIG. 8 are carried out by the components illustrated in FIG. 3. As one of ordinary skill in the art would appreciate, other steps that are not shown may be included in various embodiments of the present invention.

Method 700 begins at step 701 where a clock signal is obtained. In an embodiment of the present invention, the clock signal is uncorrected and has a duty cycle of greater than or less than 50%. In an embodiment of the present invention, a clock signal is obtained from CDR 635 in receive circuit 630 as illustrated in FIG. 7. In an embodiment of the present invention, a clock signal is applied to nodes 301 and 302, as illustrated in FIG. 3. The clock signal may be provided directly or indirectly by a buffer or amplifier. A first voltage is generated from an uncorrected clock signal and applied to a first transistor as illustrated by step 702. In an embodiment of the present invention, a voltage DCCP is generated from the uncorrected clock signal and applied to gate of transistor 310. A second voltage is also generated from the uncorrected clock signal and applied to a second transistor as illustrated by step 703. In an embodiment of the present invention, a voltage DCCN is generated from the uncorrected clock signal and applied to transistor 309. A first current is provided in step 704. In an embodiment of the present invention, a current 133 is provided as illustrated in FIG. 3. Step 705 illustrates providing a second current. In an embodiment of the present invention, current $I_{23}$ is provided as illustrated in FIG. 3.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A circuit, comprising:

a first node capable to provide a first variable voltage;

a second node capable to provide a second variable voltage;

a first transistor, coupled to the first node, having a first gate capable to provide a first current responsive to a first control voltage being applied to the first gate;

a second transistor, coupled to the second node, having a second gate capable to provide a second current responsive to a second control voltage being applied to the second gate;

a third transistor, coupled to the first node, having a third gate coupled to the first node, capable to provide a third current responsive to the first variable voltage;

a fourth transistor, coupled to the second node, having a fourth gate coupled to the second node, capable to provide a fourth current responsive to the second variable voltage;

a first control circuit, coupled to the first gate and the second node, capable to provide the first control voltage responsive to the second variable voltage; and, a second control circuit, coupled to the second gate and the first node, capable to provide the second control voltage responsive to the first variable voltage, wherein the first transistor, the second transistor, the third transistor and the fourth transistor are n-type transistors.

2. A circuit, comprising:

a first node capable to provide a first variable voltage;

a second node capable to provide a second variable voltage;

a first transistor, coupled to the first node, having a first gate capable to provide a first current responsive to a first control voltage being applied to the first gate;

a second transistor, coupled to the second node, having a second gate capable to provide a second current responsive to a second control voltage being applied to the second gate;

a first control circuit, coupled to the first gate and the second node, capable to provide the first control voltage responsive to the second variable voltage;

a second control circuit, coupled to the second gate and the first node, capable to provide the second control voltage responsive to the first variable voltage;

a third transistor, coupled to the first node, having a third gate coupled to the first node, capable to provide a third current responsive to the first variable voltage;

a fourth transistor, coupled to the second node, having a fourth gate coupled to the second node, capable to provide a fourth current responsive to the second variable voltage;

wherein the first control circuit includes, a voltage source;

a fifth transistor, coupled to the voltage source, having a gate;

a sixth transistor, coupled to the fifth transistor, having a gate coupled to the first transistor gate;

a seventh transistor, coupled to the voltage source, having a gate; and, an eighth transistor, coupled to the seventh transistor, having a gate coupled to the second node.

3. A circuit, comprising:

a first node capable to provide a first variable voltage;

a second node capable to provide a second variable voltage;

a first transistor, coupled to the first node, having a first gate capable to provide a first current responsive to a first control voltage being applied to the first gate;

a second transistor, coupled to the second node, having a second gate capable to provide a second current responsive to a second control voltage being applied to the second gate;

a first control circuit, coupled to the first gate and the second node, capable to provide the first control voltage responsive to the second variable voltage;

a second control circuit, coupled to the second gate and the first node, capable to provide the second control voltage responsive to the first variable voltage;

a third transistor, coupled to the first node, having a third gate coupled to the first node, capable to provide a third current responsive to the first variable voltage;

a fourth transistor, coupled to the second node, having a fourth gate coupled to the second node, capable to provide a fourth current responsive to the second variable voltage;

wherein the first control circuit includes, a voltage source;

a fifth transistor, coupled to the voltage source, having a gate;

a sixth transistor, coupled to the fifth transistor, having a gate coupled to the first transistor gate;

a seventh transistor, coupled to the voltage source, having a gate;

an eighth transistor, coupled to the seventh transistor, having a gate coupled to the second node;

wherein the second control circuit includes, a ninth transistor coupled to the voltage source;

a tenth transistor, coupled to the ninth transistor, having a gate coupled to the first node;

an eleventh transistor coupled to the voltage source; and, a twelfth transistor, coupled to the eleventh transistor, having a gate coupled to the second transistor gate.

4. The circuit of claim 3, wherein the circuit is a cross-coupled load with a built-in current mirrors circuit used in a double data rate receiving circuit for improving a clock signal.

5. The circuit of claim 3, wherein the circuit is in a memory device.

6. The circuit of claim 3, wherein the circuit is in a memory device controller.

7. A circuit for correcting a duty cycle of a clock signal, comprising:

a first node capable to provide a first variable voltage representing the clock signal;

a second node capable to provide a second variable voltage representing the clock signal;

a first transistor, coupled to the first node, having a first gate capable to provide a first current responsive to a first control voltage being applied to the first gate, wherein the first transistor is operating in a saturation region;

a second transistor, coupled to the second node, having a second gate capable to provide a second current responsive to a second control voltage being applied to the second gate, wherein the second transistor is operating in a saturation region;

a first control circuit, coupled to the first gate and the second node, capable to provide the first control voltage responsive to the second variable voltage;

a second control circuit, coupled to the second gate and the first node, capable to provide the second control voltage responsive to the first variable voltage, wherein the first variable voltage is greater than the second variable voltage;

a third transistor, coupled to the first node, having a third gate coupled to the first node, capable to provide a third current responsive to the first variable voltage;

a fourth transistor, coupled to the second node, having a fourth gate coupled to the second node, capable to provide a fourth current responsive to the second variable voltage;

wherein the first control circuit includes:

a voltage source;

a fifth transistor, coupled to the voltage source, having a gate;

a sixth transistor, coupled to the fifth transistor, having a gate coupled to the first transistor gate;

a seventh transistor, coupled to the voltage source, having a gate; and, an eighth transistor, coupled to the seventh transistor, having a gate coupled to the second node.

8. A circuit for correcting a duty cycle of a clock signal, comprising:

a first node capable to provide a first variable voltage representing the clock signal;

a second node capable to provide a second variable voltage representing the clock signal;

a first transistor, coupled to the first node, having a first gate capable to provide a first current responsive to a first control voltage being applied to the first gate, wherein the first transistor is operating in a saturation region;

a second transistor, coupled to the second node, having a second gate capable to provide a second current responsive to a second control voltage being applied to the second gate, wherein the second transistor is operating in a saturation region;

a first control circuit, coupled to the first gate and the second node, capable to provide the first control voltage responsive to the second variable voltage;

a second control circuit, coupled to the second gate and the first node, capable to provide the second control voltage responsive to the first variable voltage, wherein the first variable voltage is greater than the second variable voltage;

a third transistor, coupled to the first node, having a third gate coupled to the first node, capable to provide a third current responsive to the first variable voltage;

a fourth transistor, coupled to the second node, having a fourth gate coupled to the second node, capable to provide a fourth current responsive to the second variable voltage;

wherein the first control circuit includes:

a voltage source;

a fifth transistor, coupled to the voltage source, having a gate;

a sixth transistor, coupled to the fifth transistor, having a gate coupled to the first transistor gate;

a seventh transistor, coupled to the voltage source, having a gate;

an eighth transistor, coupled to the seventh transistor, having a gate coupled to the second node;

wherein the second control circuit includes, a ninth transistor coupled to the voltage source;

a tenth transistor, coupled to the ninth transistor, having a gate coupled to the first node;

an eleventh transistor coupled to the voltage source; and, a twelfth transistor, coupled to the eleventh transistor, having a gate coupled to the second transistor gate.

9. An apparatus, comprising:

a transmit circuit capable to transmit serial data; and, a receive circuit, coupled to the transmit circuit, capable to generate an output signal responsive to the serial data, wherein the receive circuit includes, a first node capable to provide a first variable voltage;

a second node capable to provide a second variable voltage;

a first transistor, coupled to the first node, having a first gate capable to provide a first current responsive to a first control voltage being applied to the first gate;

a second transistor, coupled to the second node, having a second gate capable to provide a second current responsive to a second control voltage being applied to the second gate;

a first control circuit, coupled to the first gate and the second node, capable to provide the first control voltage responsive to the second variable voltage;

a second control circuit, coupled to the second gate and the first node, capable to provide the second control voltage responsive to the first variable voltage;

a third transistor, coupled to the first node, having a third gate coupled to the first node, capable to provide a third current responsive to the first variable voltage;

a fourth transistor, coupled to the second node, having a fourth gate coupled to the second node, capable to provide a fourth current responsive to the second variable voltage;

wherein the first control circuit includes, a voltage source;

a fifth transistor, coupled to the voltage source, having a gate;

a sixth transistor, coupled to the fifth transistor, having a gate coupled to the first transistor gate;

a seventh transistor, coupled to the voltage source, having a gate; and, an eighth transistor, coupled to the seventh transistor, having a gate coupled to the second node.

10. An apparatus, comprising:

a transmit circuit capable to transmit serial data; and, a receive circuit, coupled to the transmit circuit, capable to generate an output signal responsive to the serial data, wherein the receive circuit includes, a first node capable to provide a first variable voltage;

a second node capable to provide a second variable voltage;

a first transistor, coupled to the first node, having a first gate capable to provide a first current responsive to a first control voltage being applied to the first gate;

a second transistor, coupled to the second node, having a second gate capable to provide a second current responsive to a second control voltage being applied to the second gate;

a first control circuit, coupled to the first gate and the second node, capable to provide the first control voltage responsive to the second variable voltage;

a second control circuit, coupled to the second gate and the first node, capable to provide the second control voltage responsive to the first variable voltage;

a third transistor, coupled to the first node, having a third gate coupled to the first node, capable to provide a third current responsive to the first variable voltage;

a fourth transistor, coupled to the second node, having a fourth gate coupled to the second node, capable to provide a fourth current responsive to the second variable voltage;

wherein the first control circuit includes, a voltage source;

a fifth transistor, coupled to the voltage source, having a gate;

a sixth transistor, coupled to the fifth transistor, having a gate coupled to the first transistor gate;

a seventh transistor, coupled to the voltage source, having a gate;

an eighth transistor, coupled to the seventh transistor, having a gate coupled to the second node;

wherein the second control circuit includes, a ninth transistor coupled to the voltage source;

a tenth transistor, coupled to the ninth transistor, having a gate coupled to the first node;

an eleventh transistor coupled to the voltage source; and, a twelfth transistor, coupled to the eleventh transistor, having a gate coupled to the second transistor gate.

11. The apparatus of claim 10, wherein the transmit circuit is included in a memory controller and the receive circuit is included in a memory device.

12. The apparatus of claim 10, wherein the receive circuit is a circuit used for improving a clock signal.

* * * * *